US009223054B2

(12) United States Patent  (10) Patent No.: US 9,223,054 B2
Morita                    (45) Date of Patent: Dec. 29, 2015

(54) PROXIMITY SENSOR

(71) Applicant: Panasonic Corporation, Osaka (JP)

(72) Inventor: Yosuke Morita, Shiga (JP)

(73) Assignee: PANASONIC INTELLECTUAL PROPERTY MANGEMENT CO., LTD., Osaka (JP)

( * ) Notice: Subject to any disclaimer, the term of this patent is extended or adjusted under 35 U.S.C. 154(b) by 0 days.

(21) Appl. No.: 14/371,750

(22) PCT Filed: Jan. 11, 2013

(86) PCT No.: PCT/JP2013/000094
§ 371 (c)(1),
(2) Date: Jul. 11, 2014

(87) PCT Pub. No.: WO2013/105510
PCT Pub. Date: Jul. 18, 2013

(65) Prior Publication Data
US 2015/0001414 A1    Jan. 1, 2015

(30) Foreign Application Priority Data
Jan. 13, 2012  (JP) .................................. 2012-005554

(51) Int. Cl.
*G01J 1/42*  (2006.01)
*G01V 8/20*  (2006.01)
(Continued)

(52) U.S. Cl.
CPC *G01V 8/20* (2013.01); *G01B 11/14* (2013.01); *G01J 1/429* (2013.01); *G01J 5/0025* (2013.01); *G01J 5/0809* (2013.01); *G01J 5/0868* (2013.01); *G01J 5/0896* (2013.01); *G01S 7/4813* (2013.01); *G01S 7/4815* (2013.01); *G01S 17/00* (2013.01);
(Continued)

(58) Field of Classification Search
CPC .... G01B 11/026; G06F 3/0308; G06F 3/0304
USPC ......................................................... 250/393
See application file for complete search history.

(56) References Cited

U.S. PATENT DOCUMENTS 8,134,081 B2 *  3/2012  Sakurai et al. ................. 174/256
8,217,482 B2 *  7/2012  Basoor et al. .................. 257/436
(Continued)

FOREIGN PATENT DOCUMENTS

JP  62-049257  3/1987
JP  63-003474  1/1988
(Continued)

OTHER PUBLICATIONS

International Search Report, mailed Mar. 19, 2013, in corresponding International Application No. PCT/JP2013/000094.
(Continued)

*Primary Examiner* — Kiho Kim
(74) *Attorney, Agent, or Firm* — Greenblum & Bernstein, P.L.C.

(57) ABSTRACT

A proximity sensor detects an object to be detected. The proximity sensor includes a board; at least three light emitting portions which are mounted on a surface of the board such that not all the light emitting portions is arranged on a straight line, and which emits light; and a light receiving portion which is mounted on the surface of the board so as to have a predetermined positional relationship with the three light emitting portions, and which receives reflected light derived from light emitted from the light emitting portions and reflected by the object to be detected.

8 Claims, 12 Drawing Sheets

(51) Int. Cl.
*H05K 1/02* (2006.01)
*G01S 17/00* (2006.01)
*G01B 11/14* (2006.01)
*G01S 17/02* (2006.01)
*G01S 7/481* (2006.01)
*G06F 3/03* (2006.01)
*G06F 3/0354* (2013.01)
*H03K 17/94* (2006.01)
*G01J 5/08* (2006.01)
*G01J 5/00* (2006.01)
*H05K 3/10* (2006.01)
*H03K 17/945* (2006.01)

(52) U.S. Cl.
CPC ............. *G01S 17/026* (2013.01); *G06F 3/0304* (2013.01); *G06F 3/03547* (2013.01); *H03K 17/943* (2013.01); *H05K 1/0284* (2013.01); *H03K 2017/9455* (2013.01); *H03K 2217/94111* (2013.01); *H05K 3/108* (2013.01); *H05K 2201/0338* (2013.01); *H05K 2201/10151* (2013.01); *H05K 2201/2054* (2013.01)

(56) References Cited

U.S. PATENT DOCUMENTS

| 8,304,733 B2 * | 11/2012 | Alameh et al. ................ 250/349 |
| 2008/0302951 A1 | 12/2008 | Aoki et al. |
| 2011/0063213 A1 | 3/2011 | Kang et al. |

FOREIGN PATENT DOCUMENTS

| JP | 01-171053 | 12/1989 |
| JP | 09-203631 | 8/1997 |
| JP | 10-148640 | 6/1998 |
| JP | 2000-075046 | 3/2000 |
| JP | 2001-188087 | 7/2001 |
| JP | 2002-131051 | 5/2002 |
| JP | 2008-059200 | 3/2008 |
| JP | 2009-099950 | 5/2009 |
| WO | 2007/099611 | 9/2007 |

OTHER PUBLICATIONS

Extended European Search Report, mailed Jun. 12, 2015, by the European Patent Office for the corresponding European Patent Application.

* cited by examiner

FIG. 12(A)    FIG. 12(B)
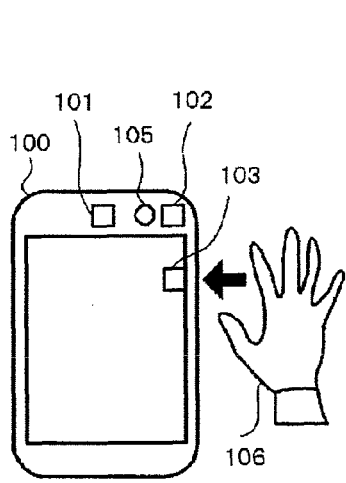
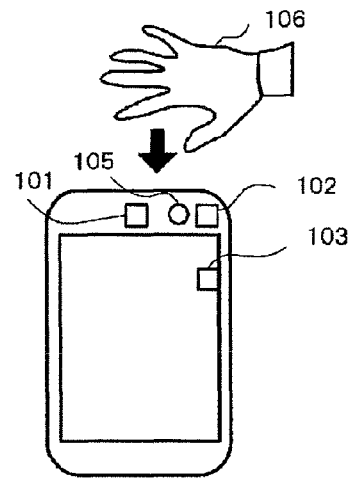
FIG. 12(C)    FIG. 12(D)
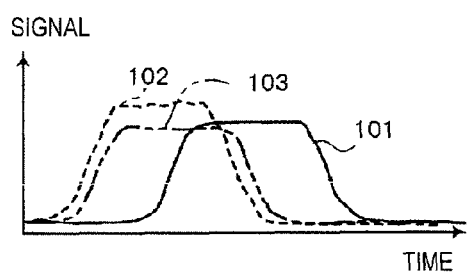
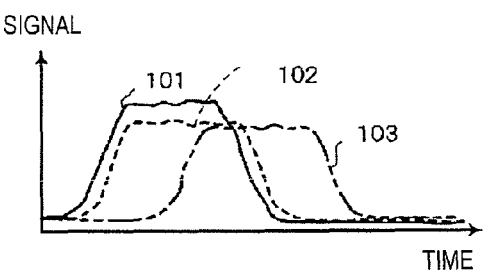
FIG. 12(E)
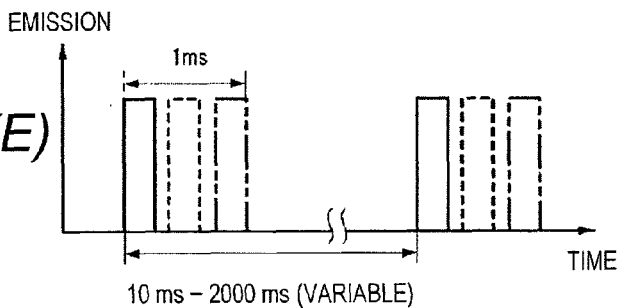

PROXIMITY SENSOR

TECHNICAL FIELD

The present invention relates to a proximity sensor for detecting an object to be detected.

BACKGROUND ART

In recent years, in electronic devices such as portable information terminals, modules produced for respective functions are often combined and mounted on a board. Thus, high functionalization in electronic devices has been developed rapidly. From the point of view about resource saving and portability, reduction in thickness and weight of electronic device is required.

However, a printed wiring board such as a glass epoxy board forming an electronic circuit has a flat structure, and there is also a restriction in the mounting form of electronic components. It is therefore difficult to attain higher functionalization and more significant reduction in thickness and weight simultaneously.

MID (Molded Interconnected Device) technology for forming an electric circuit directly in the surface of an injection-molded article has been highlighted under such background. The MID technology can provide a mechanical function as a mechanism part and an electric function as a wiring circuit board for a module board to be mounted with modules. According to the MID technology, it is therefore possible to achieve smaller size of an electric device and higher accuracy of a module board including the electric device simultaneously, and it is further possible to reduce the number of assembling man-hours of the module board.

In addition, it has been considered that an electric device such as a portable terminal or a tablet terminal is mounted with a touchless motion function as an example of a proximity sensor. The touchless motion function is a function by which, for example, vertical or horizontal motion of a hand of a user on a display of an electronic device such as a portable terminal or a tablet terminal can be detected even though the hand of the user does not touch the display.

There has been already provided a light receiving element which is mounted with a driver for driving three LED elements as light emitting portions so as to implement a touchless motion function. FIG. 12(A) is a view for explaining an operation for detecting horizontal motion of a hand of a user in a background-art touchless motion function. FIG. 12(B) is a view for explaining an operation for detecting vertical motion of the hand of the user in the background-art touchless motion function. FIG. 12(C) is a graph for explaining signal strength of reflected light in response to the horizontal motion of the hand of the user. FIG. 12(D) is a graph for explaining signal strength of reflected light in response to the vertical motion of the hand of the user. FIG. 12(E) is a chart for explaining light emitting timings of respective Ir-LEDs 101, 102 and 103.

As shown in FIG. 12(A), three near infrared light emitting elements (Ir-LEDs) 101, 102 and 103 are disposed in an upper portion of a portable terminal 100 and inside a housing of the portable terminal 100 so as to form an angle of 90° with respect to the lateral and longitudinal directions of the paper of FIG. 12(A). In addition, as shown in FIG. 12(A), in the upper portion of the portable terminal 100 and inside the housing of the portable terminal 100, a light receiving element 105 is disposed between the two lateral Ir-LEDs 101 and 102.

The three Ir-LEDs 101, 102 and 103 emit light in a time division manner so as to have a light emitting cycle of 10 ms to 2,000 ms and variable light emitting timings as shown in FIG. 12(E). When a user's hand 106 moves from right to left with respect to the portable terminal 100 as shown in FIG. 12(A) and FIG. 12(C), the light receiving element 105 receives reflected light derived from light emitted in a time division manner from the two Ir-LEDs 102 and 103 located on the right side. A little later, the light emitting element 105 further receives reflected light from the other Ir-LED 101 located on the left side. The horizontal motion of the user's hand 106 can be detected due to the deviation of the light reception timing.

In the same manner, when the user's hand 106 is moved downward with respect to the portable terminal 100 as shown in FIG. 12(C) and FIG. 12(D), the light receiving element 105 receives reflected light derived from light emitted in a time division manner from the two Ir-LEDs 101 and 102 located on the upper side. A little later, the light emitting element 105 further receives reflected light from the other Ir-LED 103 located on the lower side. The vertical motion of the user's hand 106 can be detected due to the deviation of the light reception timing.

As a prior technique related to a proximity sensor, there has been known a light receiving and emitting integrated element array which includes a board, a plurality of light receiving elements disposed in a column on the board, and a plurality of light emitting elements disposed in a column so that a plurality of ones of the light emitting elements can be provided correspondingly to each light receiving element (for example, see Patent Literature 1). The light receiving and emitting integrated element array detects the position of an object to be detected, based on the magnitude of reflected light (magnitude of photocurrent) from the object to be detected in response to light from the light emitting elements provided in a column.

RELATED ART DOCUMENTS

Patent Documents

Patent Document 1: JP-A-2009-099950

SUMMARY OF THE INVENTION

Problem to be Solved by the Invention

However, the aforementioned background-art proximity sensor has a problem as follows. In the background art, for example, Ir-LEDs serving as light emitting portions respectively must be disposed individually on a board when a touchless motion function is mounted on an electronic device such as a portable terminal or a tablet terminal. Therefore, when a set maker assembling the electronic device designs a board, the set maker must decide the positional relationship between each light emitting portion and a light receiving portion and adjust the light emitting timing (light emitting cycle) of the light emitting portion suitable to the decided positional relationship. Thus, troublesome design must be carried out.

On the other hand, the light receiving and emitting integrated element array disclosed in Patent Literature 1 indeed detects the position of an object to be detected in a predetermined direction (for example, lateral direction), but does not detect the position in directions including another direction (for example, longitudinal direction).

The present invention has been developed in consideration of the background-art circumstances. An object of the invention is to provide a proximity sensor in which light emitting timings of light emitting portions are adjusted in advance so that the design of a board can be made easy and an object to be detected can be detected with high accuracy.

Means for Solving the Problem

A proximity sensor of a first aspect of the present invention is a proximity sensor for detecting an object to be detected, including: a board; at least three light emitting portions which are mounted on a surface of the board such that not all the light emitting portions is arranged on a straight line, and which emits light; and a light receiving portion which is mounted on the surface of the board so as to have a predetermined positional relationship with the three light emitting portions, and which receives reflected light derived from light emitted from the light emitting portions and reflected by the object to be detected.

In a proximity sensor of a second aspect of the invention, the board is a three-dimensional circuit board manufactured by a one-shot laser method.

In a proximity sensor of a third aspect of the invention, the at least three light emitting portions and the light receiving portion are respectively mounted in recess portions formed in the surface of the board.

In a proximity sensor of a fourth aspect of the invention, the light receiving portion detects movement of the object to be detected, based on a received light pattern of reflected light derived from light emitted from the at least three light emitting portions and reflected by the object to be detected.

In a proximity sensor of a fifth aspect of the invention, light emission amounts of light emitted from the at least three light emitting portions are different from one another, and the light receiving portion detects a distance to the object to be detected in a direction perpendicular to the surface, based on the light emission amount of the reflected light.

In a proximity sensor of a sixth aspect of the invention, each of the recess portions in which the at least three light emitting portions are mounted has an opening portion deformed toward outside relative to the light receiving portion, such that light emitted from the light emitting portion is directed toward the outside.

In a proximity sensor of a seventh aspect of the invention, the light receiving portion and three of the light emitting portions are disposed in four corners of a rectangle on the surface of the board.

In a proximity sensor of an eighth aspect of the invention, the light receiving portion is disposed at a center of the surface of the board, and four light emitting portions are disposed around the light receiving portion.

Advantages of the Invention

According to the present invention, light emitting timings of light emitting portions are adjusted in advance so that the design of a board can be made easy, and an object to be detected can be detected with high accuracy.

BRIEF DESCRIPTION OF THE DRAWINGS

FIGS. 5(A) and 5(B) are sectional views showing a sectional structure of a proximity sensor in which light emitting elements and a light receiving element are mounted on a three-dimensional circuit board, in which FIG. 5(A) is a sectional view showing the sectional structure viewed from the direction of the arrow line A-A in FIG. 1, and FIG. 5(B) is a sectional view showing the sectional structure viewed from the direction of the arrow line B-B in FIG. 1.

FIGS. 6(A) and 6(B) are timing charts showing detection signals detected by the light receiving element in the proximity sensor when touchless motion is detected, in which FIG. 6(A) shows a case where an object to be detected moves from bottom to top of the proximity sensor shown in FIG. 1, and FIG. 6(B) shows a case where an object to be detected moves from top to bottom of the proximity sensor shown in FIG. 1.

FIGS. 7(A) and 7(B) are timing charts showing detection signals detected by the light receiving element in the proximity sensor when touchless motion is detected, in which FIG. 7(A) shows a case where an object to be detected moves from right to left of the proximity sensor shown in FIG. 1, and FIG. 7(B) shows a case where an object to be detected moves from left to right of the proximity sensor shown in FIG. 1.

FIGS. 9(A) and 9(B) are graphs showing changes of detection signals of the light receiving element with respect to a distance to an object to be detected, in which FIG. 9(A) is a graph showing an example of detection signals of the light receiving element, and FIG. 9(B) is a graph showing another example of a detection signal of the light receiving element.

FIGS. 10(A) to 10(C) are views showing the shapes of a plurality of recess portions in a three-dimensional circuit board mounted with a plurality of light emitting elements respectively in a proximity sensor according to a third embodiment, and emission directions of light emitted from the respective light emitting elements, in which FIG. 10(A) is a plan view of the proximity sensor, FIG. 10(B) is a sectional view taken from the direction of the arrow line C-C in FIG. 10(A), and FIG. 10(C) is a plan view of a proximity sensor according to a modification of the third embodiment.

FIG. 11(A) is a plan view of the proximity sensor, and FIG. 11(B) is a plan view of a proximity sensor according to a modification of the fourth embodiment.

FIG. 12(A) is a view for explaining an operation for detecting horizontal motion of a hand of a user in a background-art touchless motion function, FIG. 12(B) is a view for explaining an operation for detecting horizontal motion of the hand of the user in the background-art touchless motion function, FIG. 12(C) is a graph for explaining signal strength of reflected light in response to the horizontal motion of the hand of the user, FIG. 12(D) is a graph for explaining signal strength of reflected light in response to the vertical motion of the hand of the user, and FIG. 12(E) is a chart for explaining light emitting timings of respective Ir-LEDs.

MODE FOR CARRYING OUT THE INVENTION

Each embodiment of a proximity sensor according to the invention will be described with reference to the drawings.

The proximity sensor according to the embodiment is provided inside a housing of an electronic device such as a portable terminal or a tablet terminal so as to detect an object to be detected, such as a hand or a finger of a user.

(First Embodiment)

Figure 1:
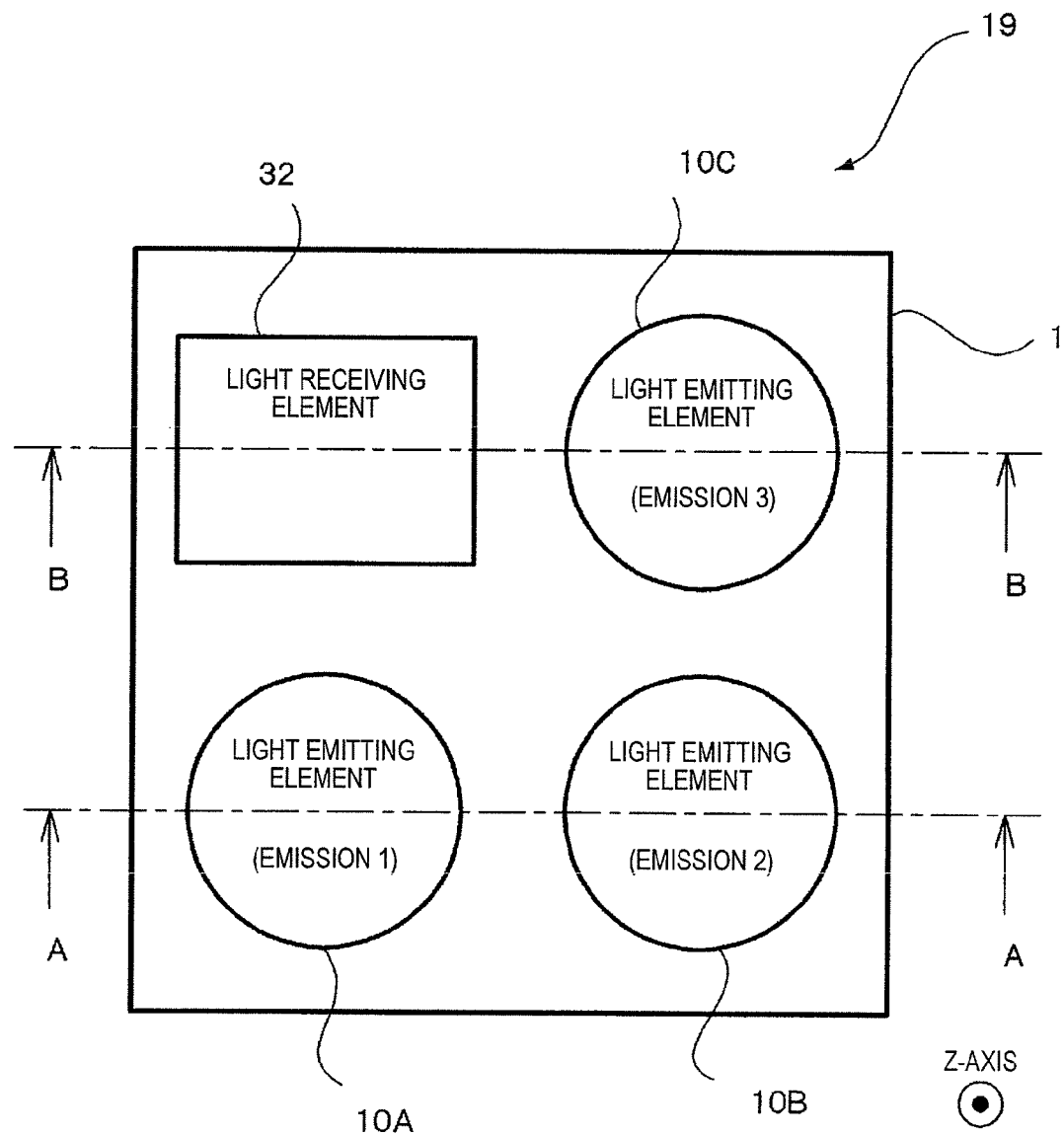
FIG. 1 is a view showing the layout of light emitting elements and a light receiving element in a proximity sensor according to a first embodiment.

FIG. 1 is a view showing the layout of light emitting elements and a light receiving element in a proximity sensor 19 according to the first embodiment. The proximity sensor 19 is constituted by at least three light emitting elements 10A, 10B and 10C and one light receiving element 32 mounted on the upper surface of a three-dimensional circuit board 1. As shown in FIG. 1, the three light emitting elements 10A, 10B and 10C and the light receiving element 32 are disposed in the four corners of the rectangular shape of the upper surface of the three-dimensional circuit board 1. That is, the three-dimensional circuit board 1 has a configuration including circular recess portions (not shown) each formed out of, for example, a circular bottom portion (bottom face) to be mounted with an electric circuit of each light emitting element 10A, 10B, 10C, and a wall face surrounding the bottom portion (bottom face), and a rectangular recess portion (not shown) formed out of, for example, a rectangular bottom portion (bottom face) to be mounted with an electric circuit of the light receiving element 32, and a wall face surrounding the bottom portion (bottom face).

The light emitting elements 10A, 10B and 10C serving as light emitting portions include Ir-LEDs emitting infrared rays (for example, near infrared rays) in a time division manner in the order of (Emission 1), (Emission 2) and (Emission 3) when driving currents are supplied thereto.

The light receiving element 32 serving as a light receiving portion has a configuration including a photodiode and a driver circuit for driving the photodiode. The driver circuit has a touchless motion function and a function of detecting a distance to an object to be detected, as will be described later.

Figure 4:
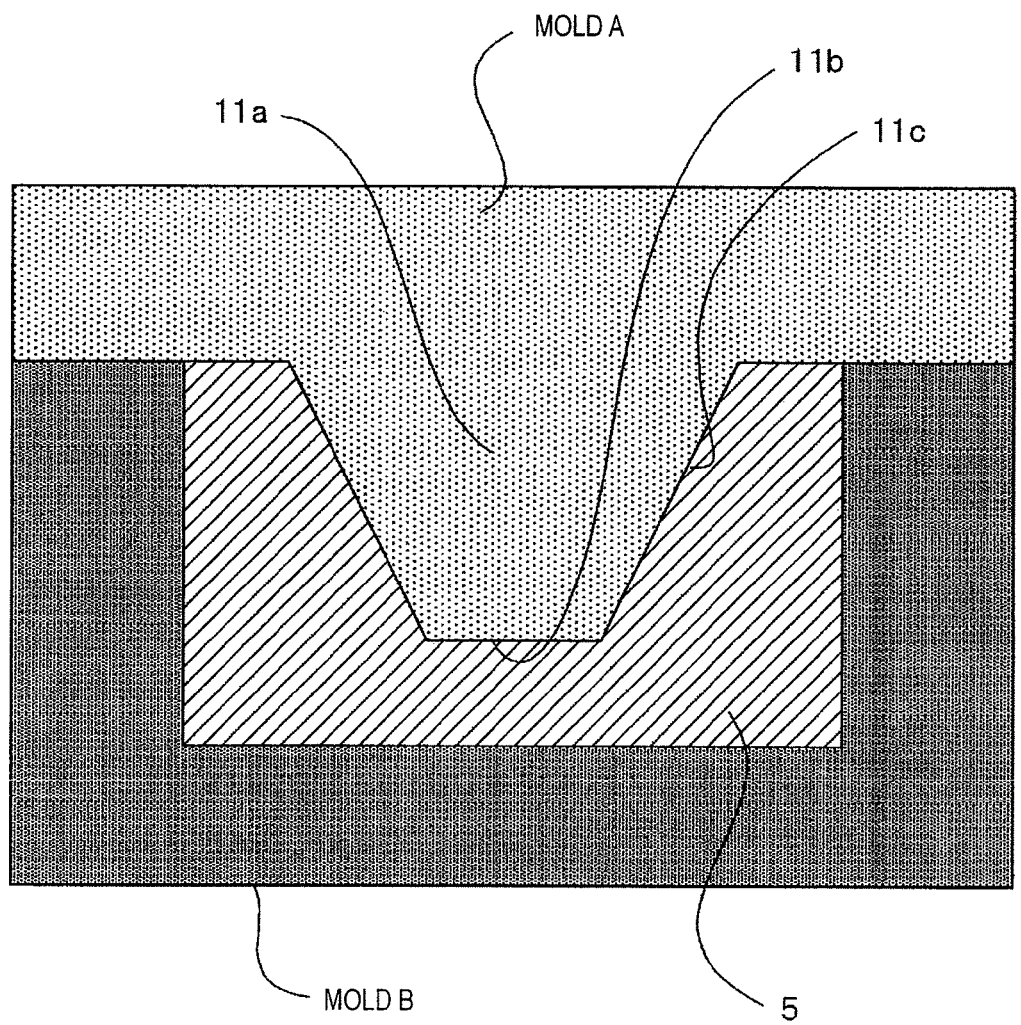
FIG. 4 is a view showing a state where a resin board is formed using a mold A and a mold B.

In addition, the light emitting elements 10A, 10B and 10C and the light receiving element 32 are mounted on the three-dimensional circuit board 1 manufactured by a manufacturing process using MID technology (see FIG. 4). The proximity 19 is manufactured thus.

Figure 2:
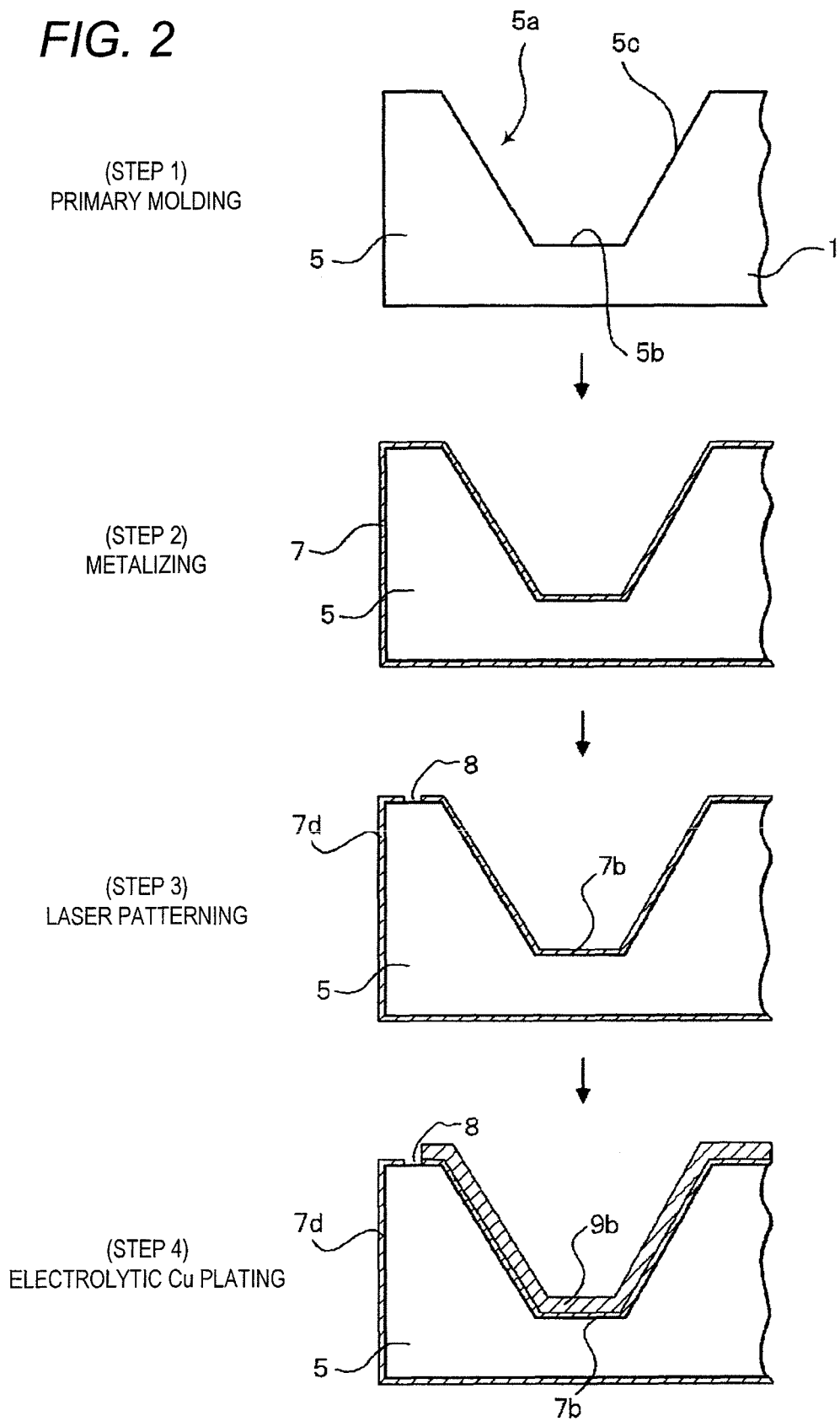
FIG. 2 is a view for explaining the first half part of a process for manufacturing a three-dimensional circuit board based on a one-shot removal method according to the first embodiment, which process is illustrated in time series using sectional views of the three-dimensional circuit board.
Figure 3:
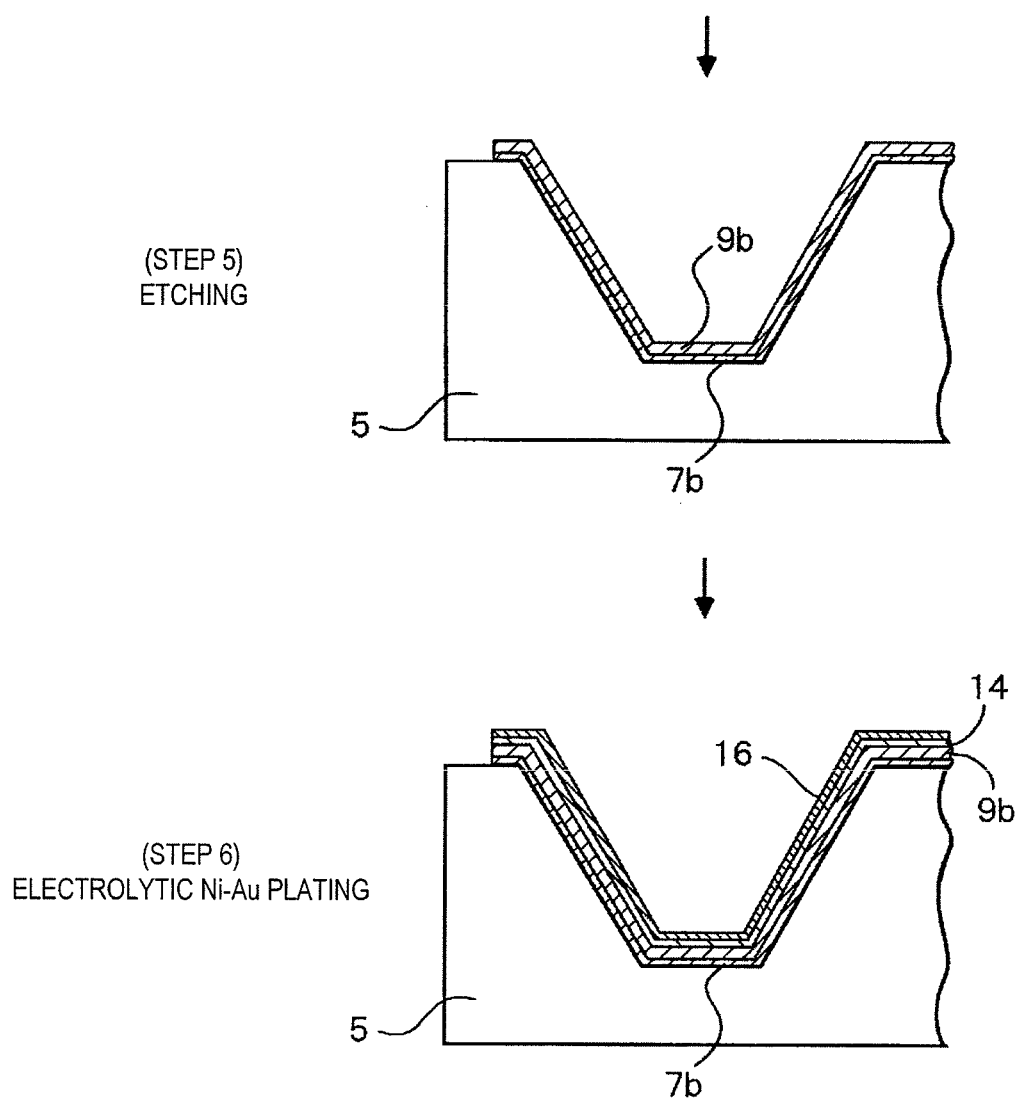
FIG. 3 is a view for explaining the second half part of the process for manufacturing the three-dimensional circuit board based on the one-shot laser method according to the first embodiment, which process is illustrated in time series using sectional views of the three-dimensional circuit board.

FIG. 2 is a view for explaining the first half part of a process for manufacturing a three-dimensional circuit board based on a one-shot laser method (one-shot laser contour removal method) according to the first embodiment, which process is illustrated in time series using sectional views of the three-dimensional circuit board. FIG. 3 is a view for explaining the second half part of the process for manufacturing the three-dimensional circuit board based on the one-shot laser method according to the first embodiment, which process is illustrated in time series using sectional views of the three-dimensional circuit board.

The one-shot laser method is a method for manufacturing a three-dimensional circuit board in such a manner that injection molding is performed once, and the contour around a circuit pattern with which an intended electric circuit will be mounted on a board manufactured by the injection molding is irradiated with laser light so as to form a desired metal layer or film.

In FIGS. 2 and 3, the process for manufacturing the three-dimensional circuit board 1 to be integrally mounted with the light emitting elements 10A, 10B and 10C and the light receiving element 32 shown in FIG. 1 will be described, for example, paying attention to the light emitting element 10A in order to make it easy to describe the process for manufacturing the three-dimensional circuit board 1. The description of FIGS. 2 and 3 can be applied to the process for manufacturing the three-dimensional circuit board 1 to be integrally mounted with the light emitting elements 10A, 10B and 10C and the light receiving element 32 shown in FIG. 1.

The process (manufacturing method) for manufacturing a three-dimensional circuit board based on the one-shot laser method is performed in the following process order from (Step 1) to (Step 6).

(Step 1) In the process of primary molding, a mold A and a mold B are placed in an injection molding machine so as to form a mold corresponding to the shape of each recess portion of the three-dimensional circuit board 1 in which, for example, the light emitting element 10A will be mounted. A resin material which can be plated is injected into a space between the mold A and the mold B. For example, polyphthalamide (PPA), alumina ($Al_2O_3$) and aluminum nitride (AlN) are used as the resin material. The process of (Step 1) is a step of preparing the three-dimensional circuit board 1 according to the embodiment. In the same process, a resin board 5 as a base (primary molded article) of the three-dimensional circuit board 1 according to the embodiment is formed. Incidentally, the preparing step is not limited to the step of injection-molding the resin board 5 in the primary molding process of (Step 1). For example, the preparing step may include a step of using a resin board 5 purchased from a third party (such as a contract manufacturer). As shown in FIG. 2, a conical recess portion 5a is formed in the resin board 5 correspondingly to the shapes of the mold A and the mold B.

FIG. 4 is a view showing a state where the resin board 5 is formed using the mold A and the mold B. A protrusion portion 11a which will abut against the recess portion 5a of the resin board 5 is formed in the mold A. A tip face 11b of the protrusion portion 11a is ground into a flat face in advance, and a side face 11c of the protrusion portion 11a is also ground into a smooth face or a curved face in advance.

In the process of (Step 1), the mold A including the tip face 11b and the side face 11c ground in advance is used so that a smooth bottom face 5b and a smooth wall face 5c as a bottom portion can be formed in the recess portion 5a of the injection-molded resin board 5.

In the process of (Step 1), a smooth bottom face 5b and a smooth curved wall face 5c may be formed in the recess portion 5a of the injection-molded resin board 5. It is preferable that plasma processing is performed on the resin board 5 as a primary molded article between the process of (Step 1) and the process of (Step 2). As a result, the surface of the resin board 5 can be activated.

(Step 2) In the process of metalizing next to the process of primary molding, a Cu thin film (copper thin film) 7 is formed on or all over the surface of the resin board 5 by sputtering. In the process of (Step 2), the Cu thin film 7 formed on or all over the surface of the resin board 5 is, for example, 0.3 μm thick. Since the mold A which has been ground is used in the process of (Step 1), the surface (the bottom face 5b and the wall face 5c) of the recess portion 5a of the resin board 5 is formed smoothly. Accordingly, the Cu thin film 7 formed on the surface of the resin board 5 is also formed smoothly in the process of (Step 2).

(Step 3) In the process of laser patterning next to the process of metalizing, a portion of a contour 8 within a predetermined range including a place where a circuit pattern to be mounted with an electric circuit of the intended light emitting element 10A will be formed is removed from the Cu thin film 7 by laser light. The predetermined range extends from a part of the left surface of the recess portion 5a of the resin board 5 to the left wall face 5c of the recess portion 5a, the bottom face 5b, the right wall face 5c of the recess portion 5a, and a part (not shown) of the right surface of the resin board 5 (see (Step 3) of FIG. 2).

Incidentally, FIG. 2 shows a manufacturing process paying attention to the light emitting element 10A. Though not shown in detail in FIG. 2, a recess portion to be mounted with an electric circuit of the light emitting element 10B is formed in the three-dimensional circuit board 1 according to the embodiment and on the right side of the three-dimensional circuit board 1 in FIG. 2 in the same manner. The right end of the aforementioned predetermined range corresponds to a part of the left surface of the recess portion (not shown) to be mounted with the electric circuit of the light emitting element 10B. As a result, a Cu thin film 7b from which the portion of the contour 8 within the aforementioned range has been removed is left on the bottom face 5b of the resin board 5, and a Cu thin film 7d is left on the side face and the back face of the resin board 5.

(Step 4) In the process of electrolytic Cu plating next to the process of laser patterning, electrolytic Cu plating is performed on the predetermined range (see the aforementioned range) including a power supply section to be mounted with the electric circuit of the intended light emitting element 10A. Due to the electrolytic Cu plating, a Cu plating layer 9b is thickly applied to the Cu thin film 7b surrounded by the portion of the contour 8 within the predetermined range including the power supply section to be mounted with the electric circuit of the intended light emitting element. That is, a Cu plating layer 9b with a predetermined thickness is formed (see (Step 4) of FIG. 2). In the process of (Step 4), the Cu plating layer 9 is 12 μm thick.

Since the mold which has been ground is used in the process of (Step 1), the molded surface of the resin board 5 serving as a base portion of the Cu plating layer 9b and hence the surface of the Cu thin film 7b formed on the molded surface are smooth. Accordingly, the thickness of the Cu plating layer 9b may be comparatively thin.

(Step 5) In the process of etching next to the process of electrolytic Cu plating, isotropic or anisotropic etching is performed on the resin board 5 where the Cu plating layer 9b has been formed in the last process of electrolytic Cu plating. By the etching in (Step 5), of the surface of the Cu plating layer 9b, for example, a thickness of about 2 μm is melted uniformly. Thus, the surface of the Cu plating layer 9b becomes smooth. As a result, the Cu plating layer 9b becomes 10 μm thick.

In the process of etching in (Step 5), etching is also performed on the Cu thin film 7d formed on a part of the surface, the side face and the back face of the resin board 5 in addition to the Cu plating layer 9b. Thus, the Cu thin film 7 which has been formed on a part of the surface, the side face and the back face of the resin board 5 is etched.

(Step 6) Finally, in the process of electrolytic Ni—Au plating next to the process of etching, a nickel (Ni) plating layer is formed by electrolytic plating and a gold (Au) plating layer is further formed on the nickel (Ni) plating layer likewise.

More specifically, electrolytic Ni plating is performed with a Watts bath on the Cu plating layer 9b which has been formed within the predetermined range including the power supply section to be mounted with the electric circuit of the intended light emitting element 10A. As a result, an Ni plating layer 14 is formed on the Cu plating layer 9b (see (Step 6) of FIG. 3). In the process of (Step 6), the Ni plating layer 14 is formed on each of the bottom face 5b and the wall face 5c of the recess portion 5a of the resin board 5 using the Watts bath, so that very high glossiness can be achieved and those faces can be made flat and smooth. Incidentally, the wall face 5c may be not flat but curved as described above.

Further, in the process of (Step 6), electrolytic Au plating is performed on the Ni plating layer 14. As a result, An Au plating layer 16 (gold film) is further formed on each Ni plating layer 14 formed on the bottom face 5b and the wall face 5c of the recess portion 5a of the resin board 5.

Due to the one-shot laser method shown in FIGS. 2 and 3, in the three-dimensional circuit board 1 according to the embodiment, the Cu thin film 7b, the Cu plating layer 9b, the Ni plating layer 14 and the Au plating layer 16 are formed sequentially within the predetermined range including the power supply section to be mounted with the electric circuit of the intended light emitting element 10A. Accordingly, in the three-dimensional circuit board 1 according to the embodiment, the Cu thin film 7b, the Cu plating layer 9b, the Ni plating layer 14 and the Au plating layer 16 are formed sequentially on the wall face 5c of the resin board 5 provided as a reflection surface for reflecting light from the light emitting element 10A.

The three-dimensional circuit board 1 according to the one-shot laser method mentioned above is manufactured by such a process. Incidentally, the thicknesses of the Cu thin film 7b, the thickness of the Cu plating layer 9b thickly applied by electrolytic plating and the thickness of the Cu plating layer 9b after etching are illustrated by way of example. Those thicknesses are not limited to those values.

Figure 5A:
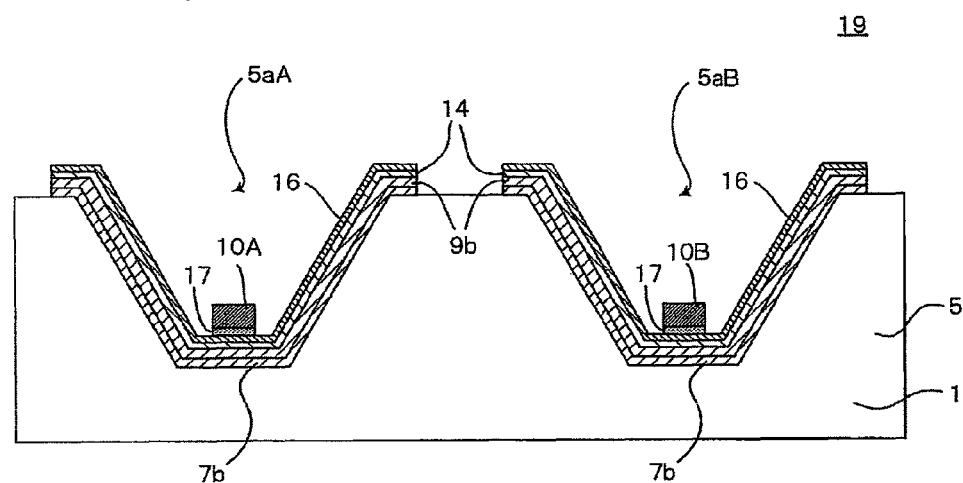
Figure 5B:
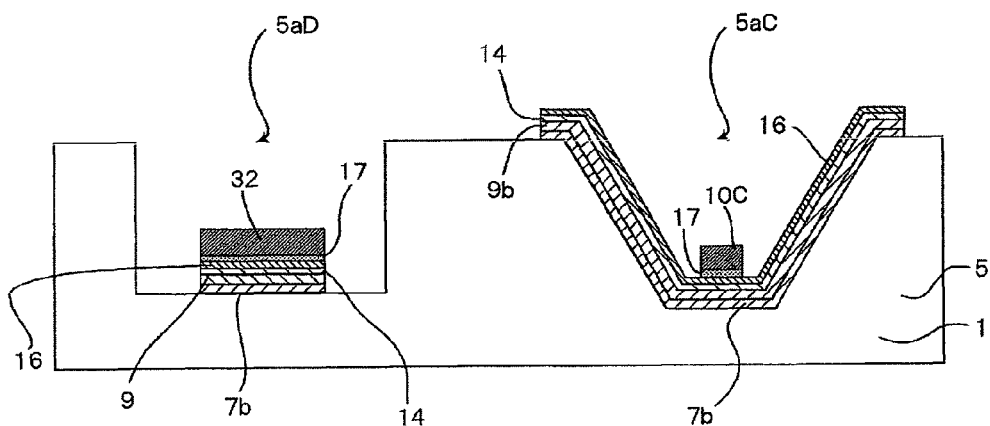

FIGS. 5(A) and 5(B) are sectional views showing a sectional structure of the proximity sensor 19 in which the light emitting elements 10A, 10B and 10C and the light receiving element 32 are mounted on the three-dimensional circuit board 1. FIG. 5(A) shows the sectional structure viewed from the direction of the arrow line A-A in FIG. 1. FIG. 5(B) shows the sectional structure viewed from the direction of the arrow line B-B in FIG. 1.

The light emitting elements 10A, 10B and 10C are mounted (placed) in recess portions 5aA, 5aB and 5aC respectively, and the light receiving element 32 is mounted in a recess portion 5aD. In the following description, any recess portion will be referred to as a recess portion 5a simply if the recess portions 5aA, 5aB and 5aC do not have to be distinguished from one another.

Each light emitting element 10A, 10B, 10C is mounted on the Au plating layer 16, and the light emitting element 10A, 10B, 10C and the Au plating layer 16 are fixed to each other through a bonding agent 17. Light emitted from the light emitting element 10A, 10B, 10C is radiated directly or reflected regularly on a reflection surface formed in the wall face of the corresponding recess portion 5aA, 5aB, 5aC. Thus, the light outgoes forward (upward in FIGS. 5(A) and 5(B)) while diffusion is suppressed. When the outgoing light is reflected by an object to be detected such as a user's finger or hand, a part of the reflected light enters the light receiving element 32 and is detected by the light receiving element 32.

In the embodiment, the three light emitting elements 10A, 10B and 10C are set to emit light in a time division manner at light emitting timings set in advance (for example, a light emitting cycle of 200 [msec]). In addition, it is preferable that the three light emitting elements 10A, 10B and 10C do not emit light concurrently but emit light sequentially with a temporal displacement from one another, for example, within a range of 1 [msec] in order to avoid interference of light.

Figure 6A:
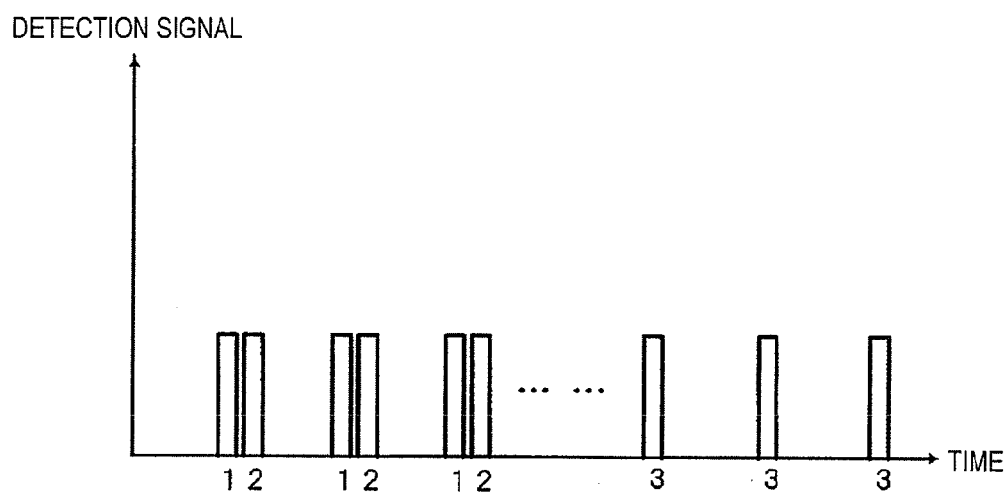
Figure 6B:
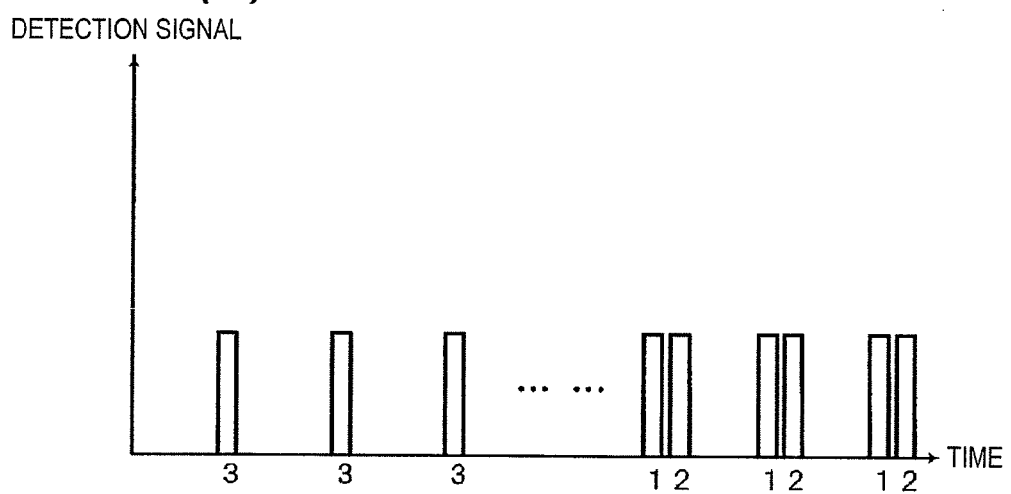

FIGS. 6(A) and 6(B) are timing charts showing detection signals detected by the light receiving element 32 in the proximity sensor 19 when touchless motion is detected. The ordinate designates the magnitude of each detection signal and the abscissa designates time. FIG. 6(A) shows a case where an object to be detected moves from bottom to top of the proximity sensor 19.

First, when the object to be detected moves from bottom to top of the proximity sensor 19 shown in FIG. 1, the light receiving element 32 detects reflected light derived from light emitted from the respective light emitting elements 10A and 10B and reflected by the object to be detected, and outputs detection signals 1 and 2. Detection signals 1, 2 and 3 correspond to the order of light emitted from the light emitting elements 10A, 10B and 10C, that is, the order of (Emission 1), (Emission 2) and (Emission 3). Further, the detection signals 1, 2 and 3 are signals generated and outputted by the driver circuit built in the light receiving element 32 based on electric energy generated by photoelectric conversion of the light receiving element 32.

As shown in FIG. 6(A), the detection signals 1 and 2 are outputted in each aforementioned light emitting cycle as long as light from the light emitting elements 10A and 10B is reflected by the object to be detected when the object to be detected is located to block a portion above the light emitting elements 10A and 10B (in the surface direction of the paper of FIG. 1, the same thing can be applied to the following description).

When the object to be detected passes above the light emitting elements 10A and 10B and reaches a position where the object to be detected blocks the light emitting element 10C, the light receiving element 32 detects reflected light derived from the light emitted from the light emitting element 10C and reflected by the object to be detected, and outputs a detection signal 3.

The driver circuit built in the light receiving element 32 can determine that the object to be detected has moved from bottom to top of the proximity sensor 19 shown in FIG. 1, based on such an output pattern (received light pattern) of the detection signals 1, 2 and 3.

FIG. 6(B) shows a case where an object to be detected moves from top to bottom of the proximity sensor 19 shown in FIG. 1. In the same manner, when the object to be detected moves from bottom to top of the proximity sensor 19 shown in FIG. 1, the light receiving element 32 detects reflected light derived from the light emitted from the light emitting element 10C and reflected by the object to be detected, and outputs a detection signal 3.

As shown in FIG. 6(B), the detection signal 3 is outputted in the aforementioned light emitting cycle as long as light from the light emitting element 10C is reflected by the object to be detected when the object to be detected is located to block a portion above the light emitting element 10C.

When the object to be detected passes above the light emitting element 10C and reaches a position where the object to be detected blocks the light emitting elements 10A and 10B, the light receiving element 32 detects reflected light derived from the light emitted from the light emitting elements 10A and 10B and reflected by the object to be detected, and outputs detection signals 1 and 2.

The driver circuit built in the light receiving element 32 can determine that the object to be detected has moved from top to bottom of the proximity sensor 19 shown in FIG. 1, based on such an output pattern (received light pattern) of the detection signals 1, 2 and 3.

Figure 7A:
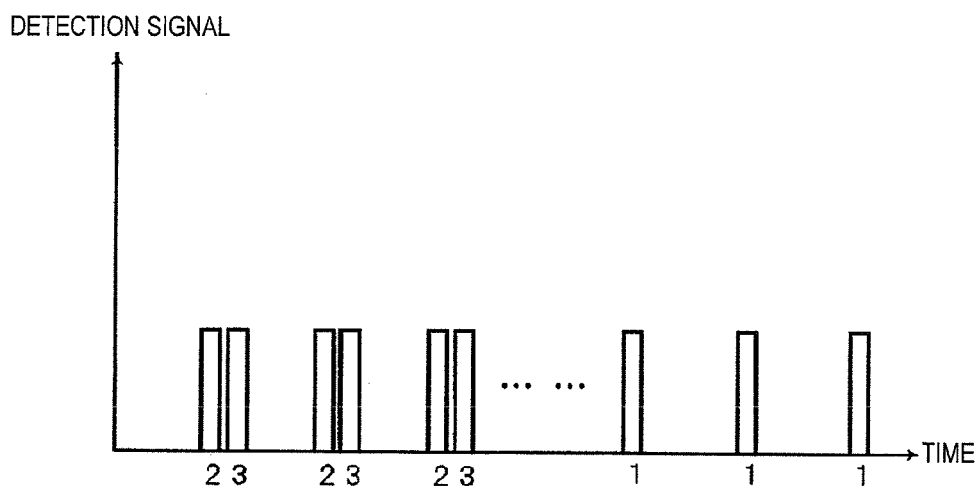
Figure 7B:
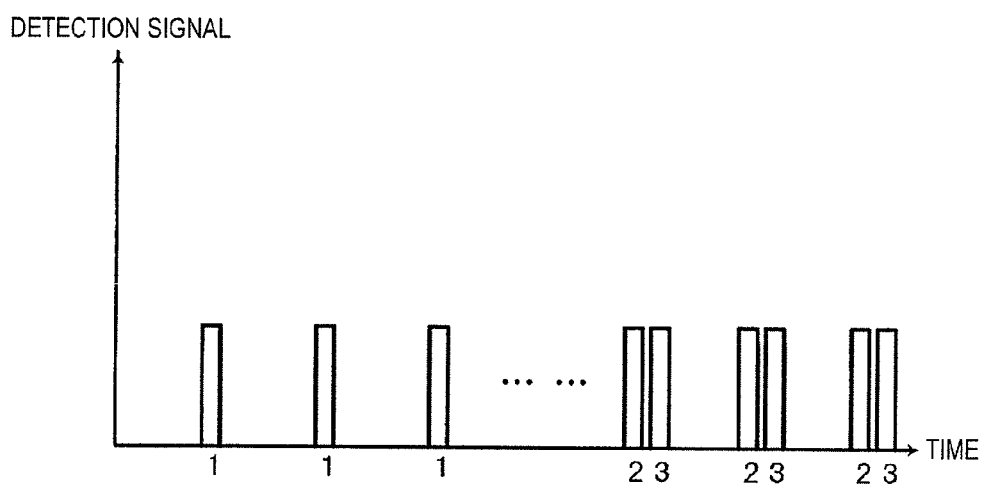

In the same manner, not only when the object to be detected moves vertically but also when the object to be detected moves horizontally, the moving direction of the object to be detected can be determined based on the output pattern (received light pattern) of the detection signals 1, 2 and 3 (see FIGS. 7(A) and 7(B)). FIGS. 7(A) and 7(B) are timing charts showing detection signals detected by the light receiving element in the proximity sensor when touchless motion is detected. FIG. 7(A) shows a case where an object to be detected moves from right to left of the proximity sensor shown in FIG. 1. FIG. 7(B) shows a case where an object to be detected moves from left to right of the proximity sensor shown in FIG. 1.

When the object to be detected moves from right to left of the proximity sensor 19 shown in FIG. 1, the light receiving element 32 detects reflected light derived from light emitted from the respective light emitting elements 10B and 10C and reflected by the object to be detected, and outputs detection signals 2 and 3.

As shown in FIG. 7(A), the detection signals 2 and 3 are outputted in each aforementioned light emitting cycle as long as light from the light emitting elements 10B and 10C is reflected by the object to be detected when the object to be detected is located to block a portion above the light emitting elements 10B and 10C.

When the object to be detected passes above the light emitting elements 10B and 10C and reaches a position where the object to be detected blocks the light emitting element 10A, the light receiving element 32 detects reflected light derived from the light emitted from the light emitting element 10A and reflected by the object to be detected, and outputs a detection signal 1.

The driver circuit built in the light receiving element 32 can determine that the object to be detected has moved from right to left of the proximity sensor 19 shown in FIG. 1, based on such an output pattern (received light pattern) of the detection signals 1, 2 and 3.

Further, when the object to be detected moves from left to right of the proximity sensor 19 shown in FIG. 1, the light receiving element 32 detects reflected light derived from light emitted from the light emitting element 10A and reflected by the object to be detected, and outputs a detection signal 1.

As shown in FIG. 7(B), the detection signal 1 is outputted in the aforementioned light emitting cycle as long as light from the light emitting element 10A is reflected by the object to be detected when the object to be detected is located to block a portion above the light emitting element 10A.

When the object to be detected passes above the light emitting element 10A and reaches a position where the object to be detected blocks the light emitting elements 10B and 10C, the light receiving element 32 detects reflected light derived from the light emitted from the light emitting elements 10B and 10C and reflected by the object to be detected, and outputs detection signals 2 and 3.

The driver circuit built in the light receiving element 32 can determine that the object to be detected has moved from left to right of the proximity sensor 19 shown in FIG. 1, based on such an output pattern (received light pattern) of the detection signals 1, 2 and 3.

Although more detailed description is omitted, the driver circuit built in the light receiving element 32 can determine the moving direction of the object to be detected, in the same manner, even when the object to be detected moves in an oblique direction of 45°, for example, from left upper to right lower of the proximity sensor 19 shown in FIG. 1.

Since the values of driving currents supplied to the light emitting elements 10A, 10B and 10C are set to be equal to one another in the embodiment, the detection signals outputted from the light receiving element 32 detecting light emitted from the light emitting elements 10A, 10B and 10C have almost the same magnitude.

In this manner, according to the proximity sensor 19 of the first embodiment, the light emitting elements 10A, 10B and 10C and the light receiving element 32 constituting the proximity sensor 19 are mounted on one three-dimensional circuit board 1 so that the proximity sensor 19 can be packaged into one. Accordingly, in the process of manufacturing the proximity sensor 19, the positional relationship among the three light emitting elements is fixed so that the three light emitting elements can be positioned with high accuracy. It is therefore possible to adjust the light emitting timings of the light emitting portions in advance to thereby make the design of the board easy, and it is possible to detect an object to be detected with high accuracy.

In addition, since the three-dimensional circuit board 1 is manufactured using the one-shot laser method, it is possible to attain higher functionalization and more significant reduction in thickness and weight.

In addition, since the three light emitting elements and the one light receiving element are mounted in the recess portions of the three-dimensional circuit board 1, the positional relationship can be fixed easily.

In addition, since the three light emitting elements 10A, 10B and 10C and the one light receiving element 32 are disposed with a predetermined positional relationship, that is, in the four corners of a rectangle here, the configuration can be made compact, and vertical and horizontal detection can be made easy when touchless motion is detected. Incidentally, any predetermined positional relationship may be used if those elements are arranged in a straight line. The elements may be disposed desirably.

(Second Embodiment)

The first embodiment showed a proximity sensor capable of detecting touchless motion in which an object to be detected such as a hand or a finger is moved along the surface of a display of an electronic device having the proximity sensor built therein. The second embodiment shows a proximity sensor not only capable of detecting the touchless motion but also capable of detecting a distance to the object to be detected in a vertical direction (Z-axis direction) from the surface of the display of the electronic device having the proximity sensor built therein.

Figure 8:
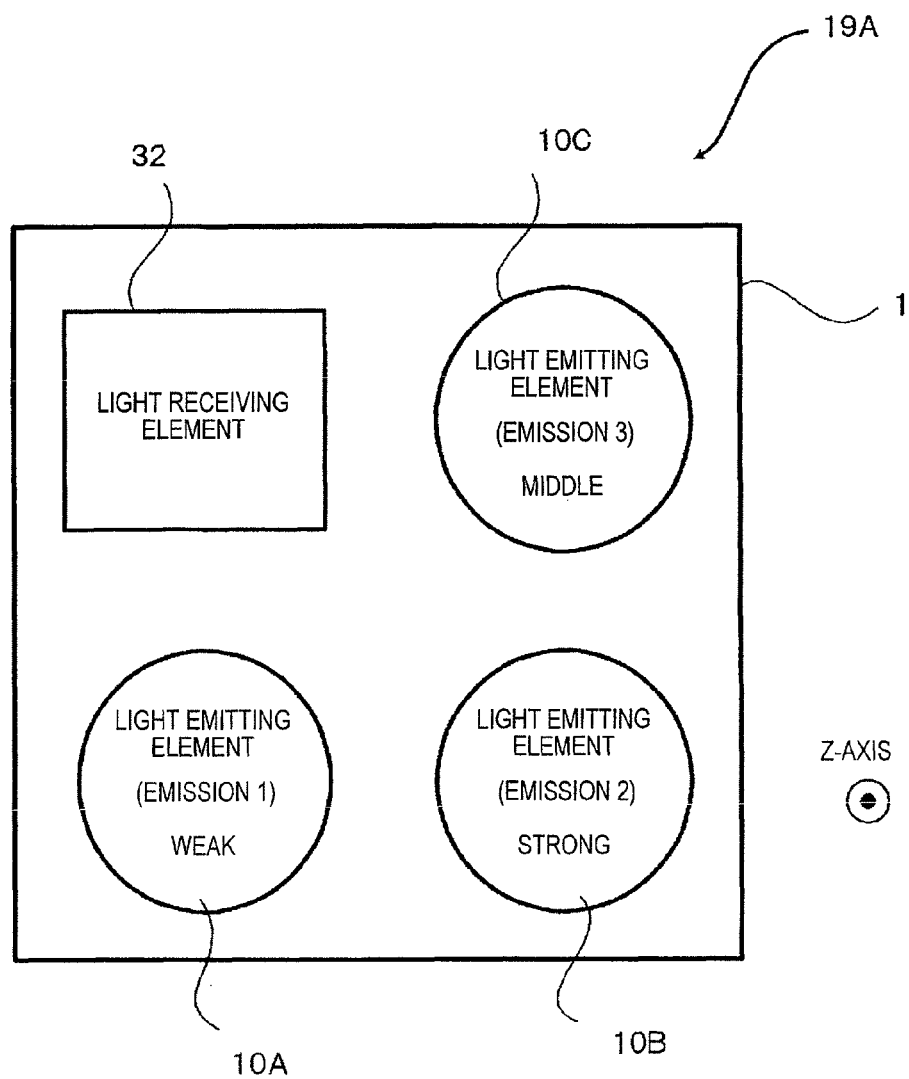
FIG. 8 is a view showing the layout of light emitting elements and a light receiving element in a proximity sensor according to a second embodiment.

FIG. 8 is a view showing the layout of light emitting elements 10A, 10B and 10C and a light receiving element 32 in a proximity sensor 19A according to the second embodiment. The proximity sensor 19A according to the second embodiment has almost the same configuration as the proximity sensor 19 according to the first embodiment. Therefore, constituent elements the same as those in the first embodiment are referenced correspondingly.

In the proximity sensor 19A according to the second embodiment, the light amounts (intensities) of near infrared rays emitted from the three light emitting elements 10A, 10B and 10C are different from one another. That is, the light emission amounts of the light emitting elements 10A, 10B and 10C are "weak", "strong" and "middle" respectively.

Accordingly, the near infrared rays emitted from the light emitting element 10B have the farthest reach distance (long distance), the near infrared rays emitted from the light emitting element 10B have a middle reach distance, and the near infrared rays emitted from the light emitting element 10C have only a short reach distance. In the embodiment, the light amount of light emitted from each light emitting element 10A, 10B, 10C is made variable in accordance with the magnitude of a driving current supplied to the light emitting element 10A, 10B, 10C.

Figure 9A:
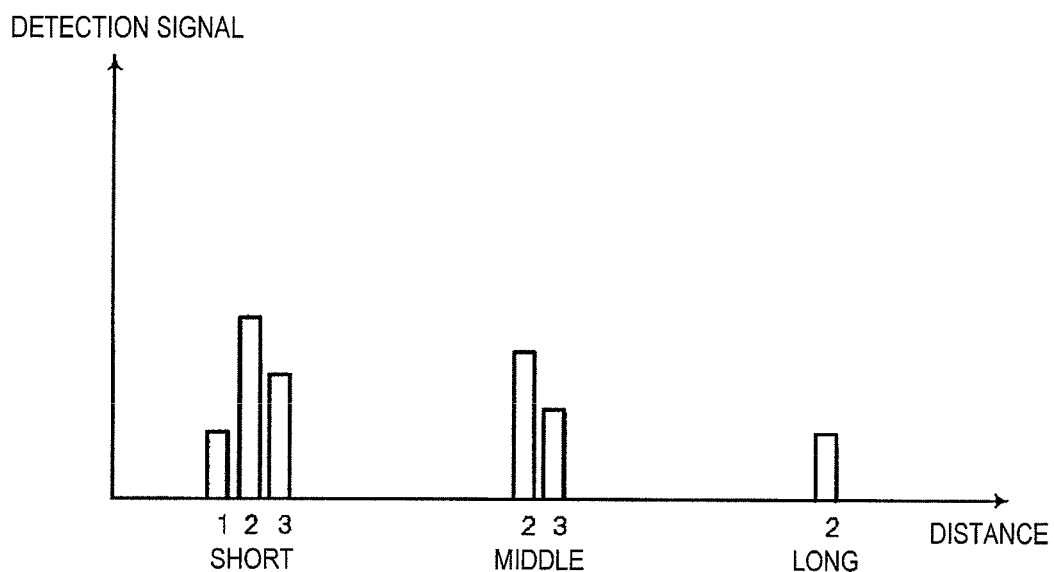
Figure 9B:
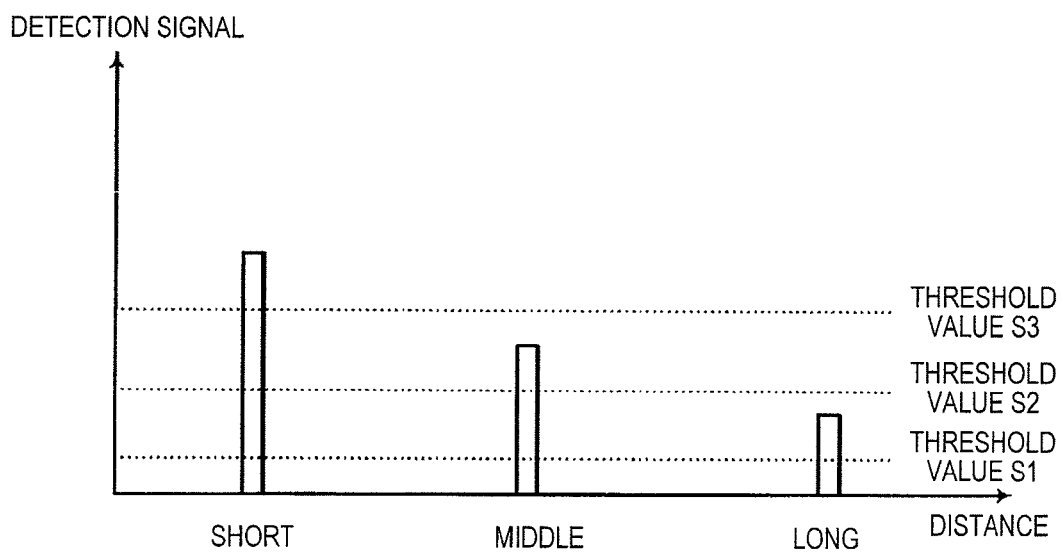

FIGS. 9(A) and 9(B) are graphs showing changes of detection signals of the light receiving element 32 with respect to a distance to an object to be detected. FIG. 9(A) is a graph showing an example of the detection signals of the light receiving element 32. When the object to be detected is at a close (short) distance, the light receiving element 32 receives reflected light from all the light emitting elements 10A, 10B and 10C, and outputs all the detection signals 1, 2 and 3. In addition, when the object to be detected is at a middle distance, the light receiving element 32 receives reflected light from the light emitting elements 10B and 10C, and outputs the detection signals 2 and 3. Further, when the object to be detected is at a long distance, the light receiving element 32 receives reflected light from only the light emitting element 10B, and outputs the detection signal 2.

FIG. 9(B) is a graph showing another example of a detection signal of the light receiving element 32. As shown in FIG. 9(B), the light receiving element 32 may output a sum value of detection signals based on electric energy generated due to photoelectric conversion based on the light amounts of reflected light from the respective light emitting elements.

Specifically, when the object to be detected is close (at a short distance), the light receiving element 32 receives reflected light from all the light emitting elements 10A, 10B and 10C, and outputs a detection signal corresponding to a sum value of all the detection signals 1, 2 and 3 shown in FIG. 9(A). In addition, when the object to be detected is slightly far (at a middle distance), the light receiving element 32 receives reflected light from the light emitting elements 10B and 10C, and outputs a detection signal corresponding to a sum value of the detection signals 2 and 3 shown in FIG. 9(A). Further, when the object to be detected is far (at a long distance), the light receiving element 32 receives reflected light from the light emitting element 10B, and outputs a detection signal corresponding to the detection signal 2 shown in FIG. 9(A).

The light receiving element 32 determines whether the distance to the object to be detected is a short distance, a middle distance or a long distance, based on a plurality of predetermined threshold values S1, S2 and S3 of the detection signal and the signal value of the detection signal corresponding to reflected light. Specifically, when the signal value of the detection signal is not lower than the threshold value S1 but lower than the threshold value S2, the light receiving element 32 determines that the distance to the object to be detected is a long distance. In the same manner, when the signal value of the detection signal is not lower than the threshold value S2 but lower than the threshold value S3, the light receiving element 32 determines that the distance to the object to be detected is a middle distance. Further, when the signal value of the detection signal is not lower than the threshold value S3, the light receiving element 32 determines that the distance to the object to be detected is a short distance.

Incidentally, the light receiving element 32 is set not to output any detection signal by the driver circuit when the amount of the reflected light is not higher than the threshold value S1 which is set in consideration of noise such as light from the outside.

In this manner, according to the proximity sensor 19A of the second embodiment, not only is it possible to detect touchless motion of an object to be detected, but it is also possible to detect a distance to the object to be detected in a direction (Z-axis direction) perpendicular to the upper surface of the proximity sensor 19A. Accordingly, it is not necessary to provide another sensor in order to detect the distance in the Z-axis direction, but the number of components can be prevented from increasing.

Although the light emitting elements 10A, 10B and 10C are disposed perpendicularly with an angle of 90° between their lateral direction and their longitudinal direction in the embodiment, the positional relationship among the light emitting elements within a plane is not limited especially in order to detect only the distance, but the light emitting elements may be disposed desirably.

In addition, according to the embodiment, the three distances including the long distance, the middle distance and the short distances are determined. However, when a plurality of threshold values are set for the signal level (received light amount) of the detection signal of the light receiving signal, distances at narrower intervals can be determined. For example, when a plurality of threshold values are set for the signal level of the detection signal of the light emitting element 10B having a "strong" light emission amount, the long distance can be classified into two or more distances. The same thing can be applied to the middle distance and the short distance.

(Third Embodiment)

In the proximity sensor according to the first embodiment, the wall face of each recess portion in a three-dimensional circuit board to be mounted with light emitting elements is formed into a conical shape. In a proximity sensor according to the third embodiment, the wall face of each of a plurality of recess portions in a three-dimensional circuit board to be mounted with a plurality of light emitting elements respectively is formed to be inclined to the outside with respect to the corresponding light emitting element so that light emitted from the light emitting element can be prevented from being received directly by a light receiving element. That is, the opening portion of each recess portion in the three-dimensional circuit board is deformed.

Figure 10A:
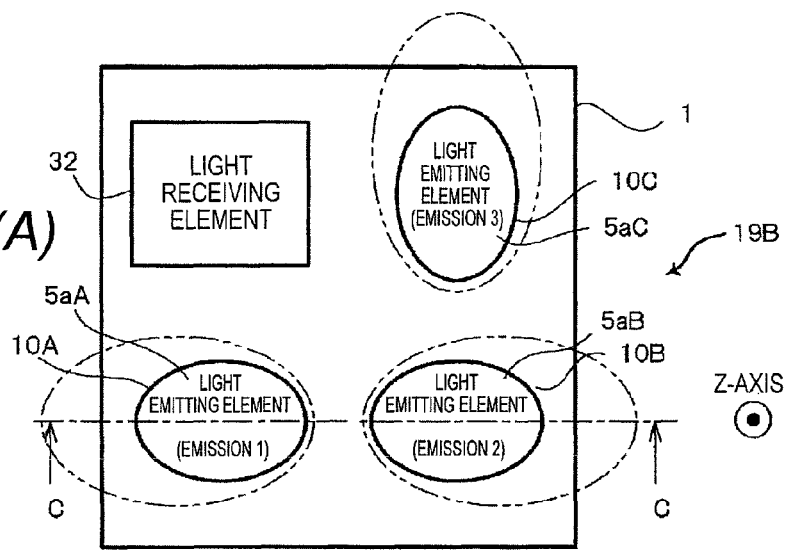
Figure 10B:
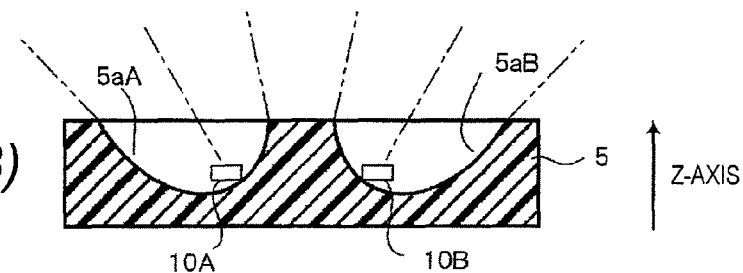
Figure 10C:
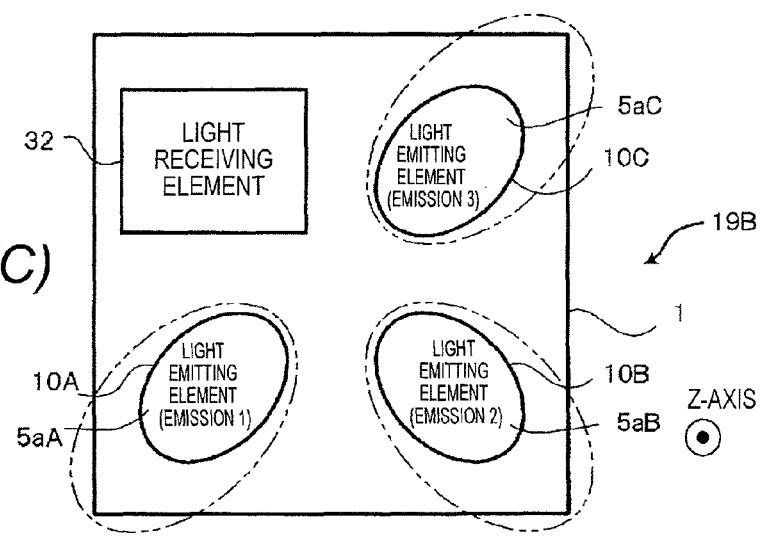

FIGS. 10(A) to 10(C) are views showing the shapes of a plurality of recess portions in a three-dimensional circuit board 1 to be mounted with a plurality of light emitting elements 10A, 10B and 10C respectively in a proximity sensor 19B according to the third embodiment, and emission directions of light emitted from the respective light emitting elements 10A, 10B and 10C. FIG. 10(A) is a plan view of the proximity sensor 19B. FIG. 10(B) is a sectional view taken from the direction of the arrow line C-C in FIG. 10(A). The proximity sensor 19B according to the third embodiment has the same configuration as the proximity sensor 19 according to the first embodiment, except for the shape of the wall face of each recess portion in the three-dimensional circuit board 1.

A recess portion 5aA, a recess portion 5aB and a recess portion 5aC formed in a resin board 5 are formed to have surfaces close to parabolic surfaces by which light emitted from the light emitting elements 10A, 10B and 10C located in focusing positions of the parabolic surfaces respectively can be reflected into parallel light. It is preferable that each parabolic surface has, for example, a parabolic shape by which light from the corresponding light emitting element can be formed into parallel light. In the embodiment, the central axes of the recess portion 5aA and the recess portion 5aB are inclined at an angle of about 30° to the lateral outside (left and right in FIG. 10(A)) with respect to the Z-axis perpendicular to the surface of the resin board 5 respectively. In addition, though not illustrated in FIG. 10(B), the central axis of the recess portion 5aC is inclined at an angle of about 30° to the longitudinal outside (upward in FIG. 10(A)) with respect to the Z-axis.

In this manner, each recess portion 5aA, 5aB, 5aC has an opening portion deformed toward the outside. Accordingly, light emitted from the light emitting elements 10A, 10B and 10C can diffuse to the outside without interfering with one another and enter the object to be detected. Thus, the proximity sensor 19B can suppress interference of light and prevent erroneous detection of the object to be detected.

The central axes of the recess portion 5aA, the recess portion 5aB and the recess portion 5aC may be inclined toward the outside and the corners (left upper, left lower and right lower in FIG. 10(C)) respectively as shown in FIG. 10(C). As a result, the proximity sensor 19B can make the light emitting elements 10A, 10B and 10C emit light without interfering with one another.

In this manner, according to the proximity sensor 19B of the third embodiment, interference of light emitted from a plurality of light emitting elements is suppressed so that it is possible to properly identify reflected light reflected by an object to be detected as to from which light emitting element the reflected light has been emitted.

(Fourth Embodiment)

Each proximity sensor according to the first to third embodiments showed the case where the number of light emitting elements is three. However, it will go well if the number of light emitting elements is three or more. The number of light emitting elements may be set desirably. The fourth embodiment shows a proximity sensor in which a light receiving element is disposed at the center of a board, and four light emitting elements are disposed around the light receiving element.

Figure 11A:
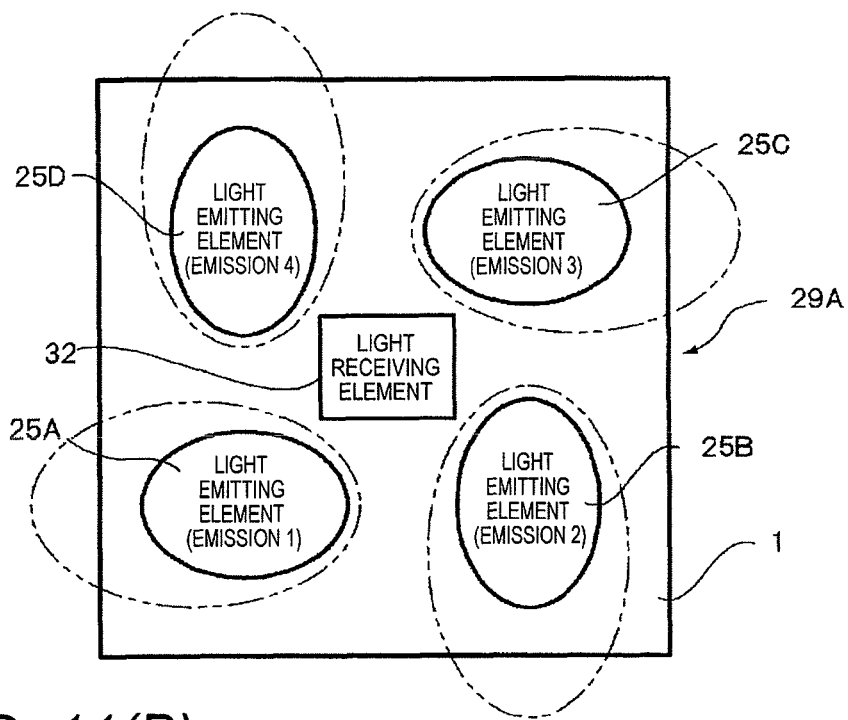
FIGS. 11(A) and 11(B) are views showing the layout of light emitting elements and a light receiving element in a proximity sensor according to a fourth embodiment, of which views.
Figure 11B:
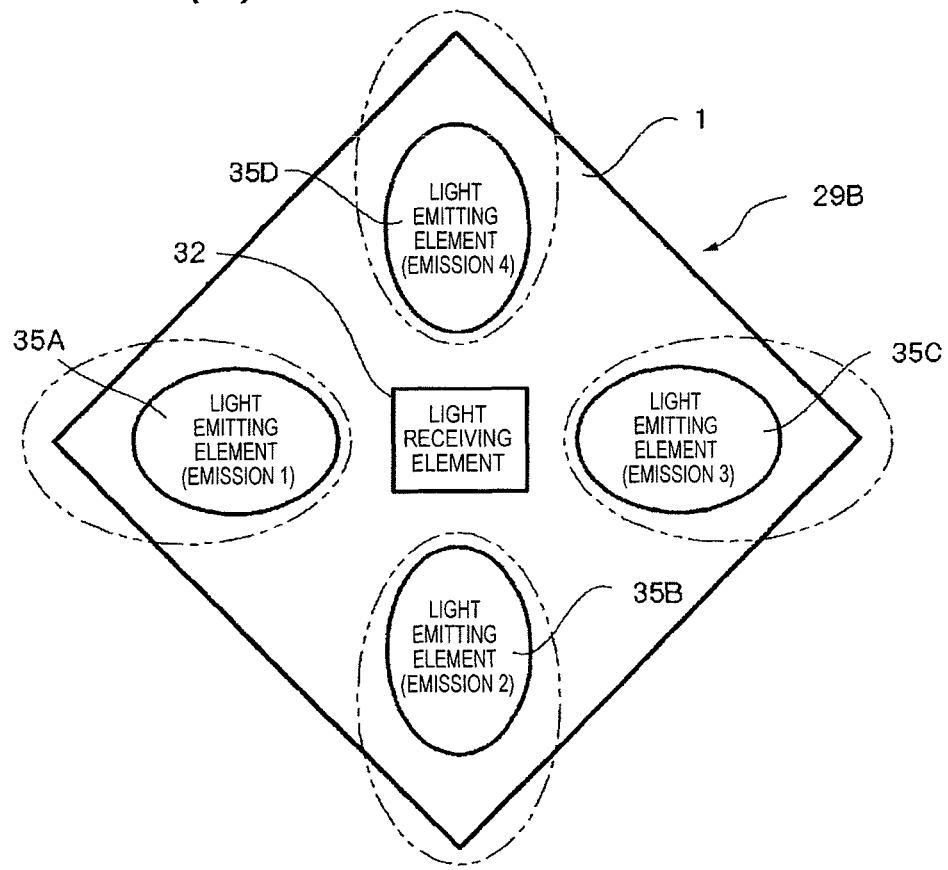

FIGS. 11(A) and 11(B) are views showing the layout of light emitting elements and a light receiving element in a proximity sensor 29A according to the fourth embodiment. FIG. 11(A) is a plan view of the proximity sensor 29A. In the proximity sensor 29A shown in FIG. 11(A), the wall surface of each recess portion 25A, 25B, 25C, 25D is formed toward the lateral (left or right in FIG. 11(A)) or longitudinal (upper or lower in FIG. 11(A)) outside.

On the other hand, in a proximity sensor 29B shown in FIG. 11(B), the wall surfaces of recess portions 35A, 35B, 35C and 35D are formed toward the outside and the corners (left, lower, right and upper in FIG. 11(B)) respectively. FIG. 11(B) is a plan view of the proximity sensor 29B according to a modification of the fourth embodiment.

According to the proximity sensor 29A of the fourth embodiment, the output pattern of detection signals detected by the light receiving element 32 is fixed when the object to be detected moves from a direction inclined at an angle of 45° with respect to the lateral direction or the longitudinal direction during the detection of touchless motion. Thus, it is possible to enhance the detection capability as to the upper/lower direction, the left/right direction, the right oblique 45° direction and the left oblique 45° direction, that is, the detection capability as to four directions. In addition, the wall faces of the recess portions in the three-dimensional circuit board 1 are inclined toward the outside relative to one another, so that mixture of light emitted from the four light emitting elements can be suppressed.

Although various embodiments have been described above with reference to the drawings, it is a matter of course that the present invention is not limited to the embodiments. It is obvious to those skilled in the art that various change examples or modification examples can be conceived within the categories stated in the scope of claims. Not to say, it is understood that those examples also belong to the technical scope of the present invention.

For example, although the aforementioned embodiments showed the case where a three-dimensional circuit board is manufactured by a one-shot laser method, the manufacturing method is not limited thereto. A two-shot method in which injection molding is performed twice for manufacturing may be used as the method for manufacturing a three-dimensional circuit board. Alternatively, an LDS (Laser Direct Structuring) method in which laser light is radiated along a circuit pattern and plating metal is deposited only in a portion irradiated with the laser light to thereby form a circuit may be used.

The present application is based on a Japanese patent application (Japanese Patent Application No. 2012-005554) filed on Jan. 13, 2012, the contents of which are incorporated herein by reference.

INDUSTRIAL APPLICABILITY

The present invention is useful to provide a proximity sensor for detecting an object to be detected, in which light emitting timings of light emitting portions are adjusted in advance so that the design of a board can be made easy and the object to be detected can be detected with high accuracy.

DESCRIPTION OF REFERENCE SIGNS

1: Three-Dimensional Circuit Board
5: Board
5a, 5aA, 5aB, 5aC, 5aD, 25A, 25B, 25C, 25D: Recess Portion
5b: Bottom Face
5c: Wall Face
7: Cu Thin Film
8: Contour
9b: Cu Plating Layer
10A, 10B, 10C: Light Emitting Element
14: Ni Plating Layer
16: Au Plating Layer
17: Bonding Agent
19, 19A, 19B, 29A, 29B: Proximity Sensor
32: Light Receiving Element

The invention claimed is:

1. A proximity sensor for detecting an object to be detected, comprising:
a board;
at least three light emitting portions which are mounted on a surface of the board such that not all the light emitting portions is arranged on a straight line, and which emits light; and
a light receiving portion which is mounted on the surface of the board so as to have a predetermined positional relationship with the three light emitting portions, and which receives reflected light derived from light emitted from the light emitting portions and reflected by the object to be detected,
wherein the at least three light emitting portions and the light receiving portion are respectively mounted in recess portions formed in the surface of the board,
wherein a plating layer is formed on an inner wall of each of the recess portions in which the light emitting portions are mounted, the plating layer forming a reflecting part, and
wherein a light emitting portion mounting part, on which a light emitting portion is mounted, and the reflecting part are integrally formed in each of the recess portions in which the light emitting portions are mounted.

2. The proximity sensor according to claim 1, wherein the board is a three-dimensional circuit board manufactured by a one-shot laser method.

3. The proximity sensor according to claim 1, wherein the light receiving portion detects movement of the object to be detected, based on a received light pattern of reflected light derived from light emitted from the at least three light emitting portions and reflected by the object to be detected.

4. The proximity sensor according to claim 1, wherein light emission amounts of light emitted from the at least three light emitting portions are different from one another, and
wherein the light receiving portion detects a distance to the object to be detected in a direction perpendicular to the surface, based on the light emission amount of the reflected light.

5. The proximity sensor according to claim 1, wherein each of the recess portions in which the at least three light emitting portions are mounted has an opening portion deformed toward outside relative to the light receiving portion, such that light emitted from the light emitting portion is directed toward the outside.

6. The proximity sensor according to claim 1, wherein the light receiving portion and three of the light emitting portions are disposed in four corners of a rectangle on the surface of the board.

7. The proximity sensor according to claim 1, wherein the light receiving portion is disposed at a center of the surface of the board, and four light emitting portions are disposed around the light receiving portion.

8. A proximity sensor for detecting an object to be detected, comprising:
a board;
at least three light emitting portions which are mounted on a surface of the board such that not all the light emitting portions is arranged on a straight line, and which emits light; and
a light receiving portion which is mounted on the surface of the board so as to have a predetermined positional relationship with the three light emitting portions, and which receives reflected light derived from light emitted from the light emitting portions and reflected by the object to be detected,
wherein the at least three light emitting portions and the light receiving portion are respectively mounted in recess portions formed in the surface of the board, and
wherein each of the recess portions in which the at least three light emitting portions are mounted has an opening portion deformed toward outside relative to the light receiving portion, such that light emitted from the light emitting portion is directed toward the outside.

* * * * *